United States Patent
Zhao et al.

(10) Patent No.: US 11,544,141 B2
(45) Date of Patent: Jan. 3, 2023

(54) DATA STORAGE DETECTION METHOD AND APPARATUS, STORAGE MEDIUM AND ELECTRONIC APPARATUS

(71) Applicant: CENTEC NETWORKS (SUZHOU) CO., LTD., Jiangsu (CN)

(72) Inventors: Zicang Zhao, Jiangsu (CN); Xianghong Gu, Jiangsu (CN); Lei Li, Jiangsu (CN); Zhichuan He, Jiangsu (CN); Fushan Jia, Jiangsu (CN)

(73) Assignee: Suzhou Centec Communications Co., Ltd., Jiangsu (CN)

( * ) Notice: Subject to any disclaimer, the term of this patent is extended or adjusted under 35 U.S.C. 154(b) by 0 days.

(21) Appl. No.: 17/312,958

(22) PCT Filed: Jun. 11, 2019

(86) PCT No.: PCT/CN2019/090739
§ 371 (c)(1),
(2) Date: Jun. 11, 2021

(87) PCT Pub. No.: WO2020/124960
PCT Pub. Date: Jun. 25, 2020

(65) Prior Publication Data
US 2022/0066864 A1   Mar. 3, 2022

(30) Foreign Application Priority Data

Dec. 18, 2018 (CN) .......................... 201811551079.1

(51) Int. Cl.
*G06F 11/10* (2006.01)
*H03M 13/09* (2006.01)

(52) U.S. Cl.
CPC ....... *G06F 11/1004* (2013.01); *H03M 13/096* (2013.01)

(58) Field of Classification Search
CPC .... G06F 11/10; G06F 11/1004; H03M 13/096
USPC ........................................................ 714/807
See application file for complete search history.

(56) References Cited

U.S. PATENT DOCUMENTS

| | | | |
|---|---|---|---|
| 7,496,692 B2 | 2/2009 | Holm et al. | |
| 8,887,011 B2 | 11/2014 | Luo et al. | |
| 9,170,880 B1 * | 10/2015 | Dropps | G06F 11/1064 |
| 9,432,298 B1 * | 8/2016 | Smith | H04L 47/34 |

(Continued)

FOREIGN PATENT DOCUMENTS

| | | |
|---|---|---|
| CN | 103678028 A | 3/2014 |
| CN | 106648968 A | 5/2017 |

(Continued)

*Primary Examiner* — Shelly A Chase
*Assistant Examiner* — Enamul M Kabir
(74) *Attorney, Agent, or Firm* — Yu Gang

(57) ABSTRACT

Provided is a method for detecting stored data and device, a storage medium and an electronic device. The method includes: the first check information of first data stored in a memory in the current period is determined; the first check information is compared with second check information to obtain a check result, wherein the second check information is check information of second data stored in the memory in a period prior to the current period; and the correctness of storage of the second data is detected according to the check result.

7 Claims, 4 Drawing Sheets

(56) References Cited

U.S. PATENT DOCUMENTS

| | | | | |
|---|---|---|---|---|
| 10,243,590 | B1* | 3/2019 | Seshadri | G11C 15/00 |
| 10,684,961 | B1* | 6/2020 | Seshadri | G06F 11/1064 |
| 2006/0251108 | A1* | 11/2006 | Hendel | H04L 49/9063 |
| | | | | 370/463 |
| 2007/0064461 | A1* | 3/2007 | Srinivasan | G11C 15/04 |
| | | | | 365/49.1 |
| 2008/0065821 | A1* | 3/2008 | Robotham | G11C 15/00 |
| | | | | 711/108 |
| 2016/0266964 | A1* | 9/2016 | Uekusa | G11C 29/70 |
| 2016/0283316 | A1* | 9/2016 | Abali | H03M 7/00 |
| 2016/0283317 | A1* | 9/2016 | Abali | G06F 11/1004 |
| 2017/0206129 | A1* | 7/2017 | Yankilevich | G11C 29/10 |

FOREIGN PATENT DOCUMENTS

| | | |
|---|---|---|
| CN | 107239361 A | 10/2017 |
| CN | 108319719 A | 7/2018 |
| CN | 109800104 A | 5/2019 |
| WO | 108196975 A | 6/2018 |

\* cited by examiner

DATA STORAGE DETECTION METHOD AND APPARATUS, STORAGE MEDIUM AND ELECTRONIC APPARATUS

CROSS-REFERENCE TO RELATED APPLICATIONS

The present disclosure claims priority to Chinese Patent Application No. 201811551079.1, filed to the China Patent Office on Dec. 18, 2018, the disclosure of which is hereby incorporated by reference in its entirety.

TECHNICAL FIELD

The disclosure relates to the field of computers, and in particular to a method and device for detecting stored data, a storage medium and an electronic device.

BACKGROUND

A chip of a Ternary Content Addressable Memory (TCAM) includes an Application Specific Integrated Circuit (ASIC), a Network Processor (NP), a Field Programmable Gate Array (FPGA), etc. During the use of the TCAM, errors may occur in the TCAM due to the external use environment.

For the above technical problem, no effective solution has been proposed in related art.

SUMMARY

Embodiments of the disclosure provide a method for detecting stored data and device, a storage medium and an electronic device to at least solve the problem in the related art that the correctness of data storage cannot be quickly detected.

According to an embodiment of the disclosure, a method for detecting stored data is provided, which may include that: first check information of first data stored in a memory in the current period is determined; the first check information is compared with second check information to obtain a check result, the second check information being check information of second data stored in the memory in a period prior to the current period; and the correctness of storage of the second data is detected according to the check result.

In an embodiment, before the first check information of the first data stored in the memory in the current period is determined, the method may further include that: the second data is written in the memory; and a second check code of the second data is calculated by using a Cyclic Redundancy Check (CRC) algorithm. The second check code is included in the second check information.

In an embodiment, after the second check code of the second data is calculated by using the CRC algorithm, the method may further include that: the second check code is stored in the memory.

In an embodiment, that the first check information of the first data stored in the memory in the current period is determined may include that: in the current period, the memory is scanned, and a first check code of the first data is calculated by using the CRC algorithm. The first check code is included in the first check information.

In an embodiment, that the correctness of storage of the second data is detected according to the check result may include that: when the first check code is inconsistent with the second check code, it is determined that an error occurs in the second data stored in the memory, and error information is obtained.

In an embodiment, after the error information is obtained, the method may further include that: the error information is sent to a Central Processing Unit (CPU) in an interrupt mode to instruct the CPU to restore the storage of the second data in the memory.

According to another embodiment of the disclosure, a device for detecting stored data is provided, which may include: a first determining module, configured to determine the first check information of the first data stored in the memory in the current period; a second determining module, configured to compare the first check information with the second check information to obtain the check result, the second check information being check information of the second data stored in the memory in a period prior to the current period; and a detecting module, configured to detect the correctness of storage of the second data according to the check result.

According to yet another embodiment of the disclosure, a storage medium is also provided. The storage medium stores a computer program. The computer program is configured to execute, when running, steps in any of the above method embodiments.

According to yet another embodiment of the disclosure, an electronic device is also provided, which includes a memory and a processor. The memory stores a computer program. The processor is configured to run the computer program to execute steps in any of the above method embodiments.

Through the embodiments of the disclosure, the first check information of the first data stored in the memory in the determined current period is determined; the first check information is compared with the second check information to obtain the check result, the second check information being check information of the second data stored in the memory in a period prior to the current period; and the correctness of data storage is detected according to the check result. That is, whether the data storage is correct can be quickly detected. Therefore, the problem in the related art of being unable to quickly detect the correctness of data storage can be solved, thereby achieving the effect of quickly detecting whether the data storage is correct.

BRIEF DESCRIPTION OF THE DRAWINGS

The accompanying drawings described here are used for providing further understanding of the embodiments of the disclosure, and constitute a part of the disclosure. Schematic embodiments of the embodiments of the disclosure and description thereof are used for illustrating the embodiments of the disclosure and not intended to form an improper limit to the embodiments of the disclosure. In the accompanying drawings.

DETAILED DESCRIPTION OF THE EMBODIMENTS

The disclosure is elaborated below with reference to the accompanying drawings and embodiments. It is to be noted that the embodiments in the disclosure and characteristics in the embodiments may be combined without conflicts.

It should be noted that the specification and claims of the disclosure and terms "first", "second", etc. in the foregoing drawings are used for distinguishing similar objects rather than describing a specific sequence or a precedence order.

Figure 1:
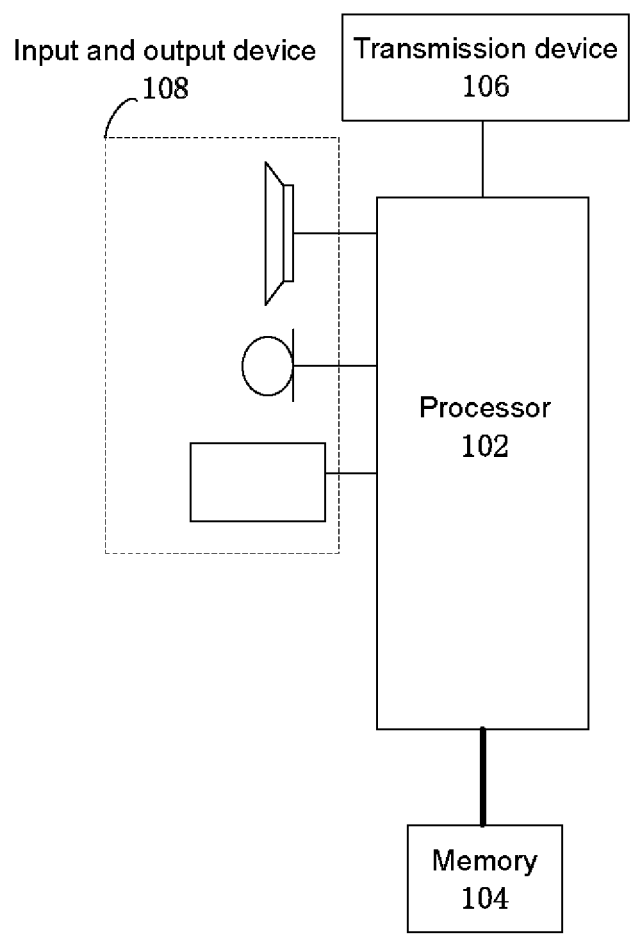
FIG. 1 is a structural block diagram of hardware of a mobile terminal for a method for detecting stored data according to an embodiment of the disclosure.

The method embodiment provided by the disclosure may be performed in a mobile terminal, a computer terminal or similar operating devices. Taking that the method is performed on a mobile terminal as an example, FIG. 1 is a structural block diagram of hardware of a mobile terminal for a method for detecting stored data according to an embodiment of the disclosure. As shown in FIG. 1, the mobile terminal 10 may include one or more (only one is shown in FIG. 1) processors 102 (the processors 102 may include, but not limited to, a Micro Processor Unit (MCU) or a Field Programmable Gate Array (FPGA), and other processing devices), a memory 104 configured to store data. Optionally, the mobile terminal may also include a transmission device 106 with a communication function and an input and output device 108. Those of ordinary skill in the art should know that the structure shown in FIG. 1 is only schematic and not intended to limit the structure of the mobile terminal. For example, the mobile terminal 10 may also include more or less components than that in FIG. 1, or has a configuration different from that in FIG. 1.

The memory 104 may be configured to store a computer program, for example, a software program and a module of application software, for example, a computer program corresponding to the data storage detection method in the embodiments of the disclosure. The processor 102 runs the computer program stored in the memory 104, thereby executing various functional applications and data processing, namely implementing the above method. The memory 104 may include a high-speed random access memory and may also include a nonvolatile memory, for example, one or more magnetic storage devices, flash memories or other nonvolatile solid-state memories. In some examples, the memories 104 may further include memories remotely set relative to the processor 102, and these remote memories may be connected to the mobile terminal 10 through the network. An example of the network includes, but not limited to, the Internet, an Intranet, a local area network, a mobile communication network and a combination thereof.

The transmission device 106 is configured to receive or send data through a network. A specific example of the network may include a wireless network provided by a communication provider of the mobile terminal 10. In an example, the transmission device 106 includes a Network Interface Controller (NIC), which may be connected with other network devices through a base station, thereby communicating with the Internet. In an example, the transmission device 106 may be a Radio Frequency (RF) module, which is configured to communicate with the Internet in a wireless manner.

Figure 2:
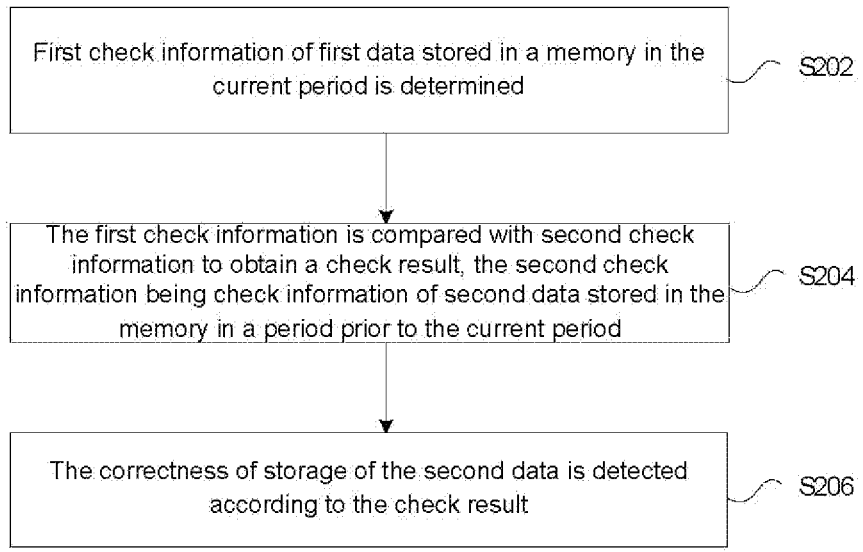
FIG. 2 is a flowchart of a method for detecting stored data according to an embodiment of the disclosure.

A method for detecting stored data is provided in an embodiment. FIG. 2 is a flowchart of the method for detecting stored data according to an embodiment of the disclosure. As shown in FIG. 2, the flow includes the following steps.

At S202, first check information of first data stored in a memory in the current period is determined.

At S204, the first check information is compared with second check information to obtain a check result. The second check information is check information of second data stored in the memory in a period prior to the current period.

At S206, the correctness of storage of the second data is detected according to the check result.

Through the above steps, the first check information of the first data stored in the memory in the determined current period is determined, the first check information is compared with the second check information to obtain the check result, the second check information being check information of the second data stored in the memory in a period prior to the current period; and the correctness of data storage is detected according to the check result. That is, whether the data storage is correct can be quickly detected. Therefore, the problem in the related art of being unable to quickly detect the correctness of data storage can be solved, thereby achieving the effect of quickly detecting whether the data storage is correct.

In an embodiment, the execution body of the above steps may be, but not limited to, a terminal.

It is to be noted that the second data is the original data before it is stored in the memory, and the first data is the data after it is stored in the memory.

In an optional embodiment, before the first check information of the first data stored in the memory in the current period is determined, it is needed to write the second data in the memory and calculate a second check code of the second data by using a CRC algorithm. The second check code is included in the second check information.

It is to be noted that before the second data is written in the memory, a CPU makes a data backup for the content of the TCAM.

It is to be noted that CRC check is a data transmission error detection function, which is essentially to perform polynomial calculation on the data and attach the obtained result to the data. A receiving device also performs the same algorithm. If a CRC value calculated is consistent with that in the data, it is indicated that there is no error in the data transmission; or else, it is considered that there is an error in the data transmission.

The CRC check includes the following steps.

At S1, polynomial calculation is performed based on the data.

At S2, a check code calculated is attached to the last position of the data.

At S3, the receiving device also performs the same algorithm to perform the polynomial calculation on the data to obtain the check code.

At S4, the values of two check codes are compared; if they are inconsistent, there is an error in the data.

In an optional embodiment, after the second check code of the second data is calculated by using the CRC algorithm, the second check code can be stored in the memory.

It is to be noted that the second check code can be considered as the original check code. The chip stores this check code in a Static Random Access Memory (SRAM).

In an optional embodiment, that the first check information of the first data stored in the memory in the current period is determined includes that: in the current period, the memory is scanned, and a first check code of the first data is calculated by using the CRC algorithm. The first check code is included in the first check information.

It is to be noted that the chip will periodically scan the TCAM, and calculate the check code by the same CRC algorithm according to the current TCAM content.

In an optional embodiment, when the first check code is inconsistent with the second check code, it is determined that an error occurs in the second data stored in the memory, and error information is obtained; and it is determined based on the error information that there is a problem with the data stored in the memory. The error information is sent to the CPU in an interrupt mode to instruct the CPU to restore the storage of the second data in the memory. After receiving the interrupt, the CPU restores the TCAM according to the data previously backed up.

Figure 3:
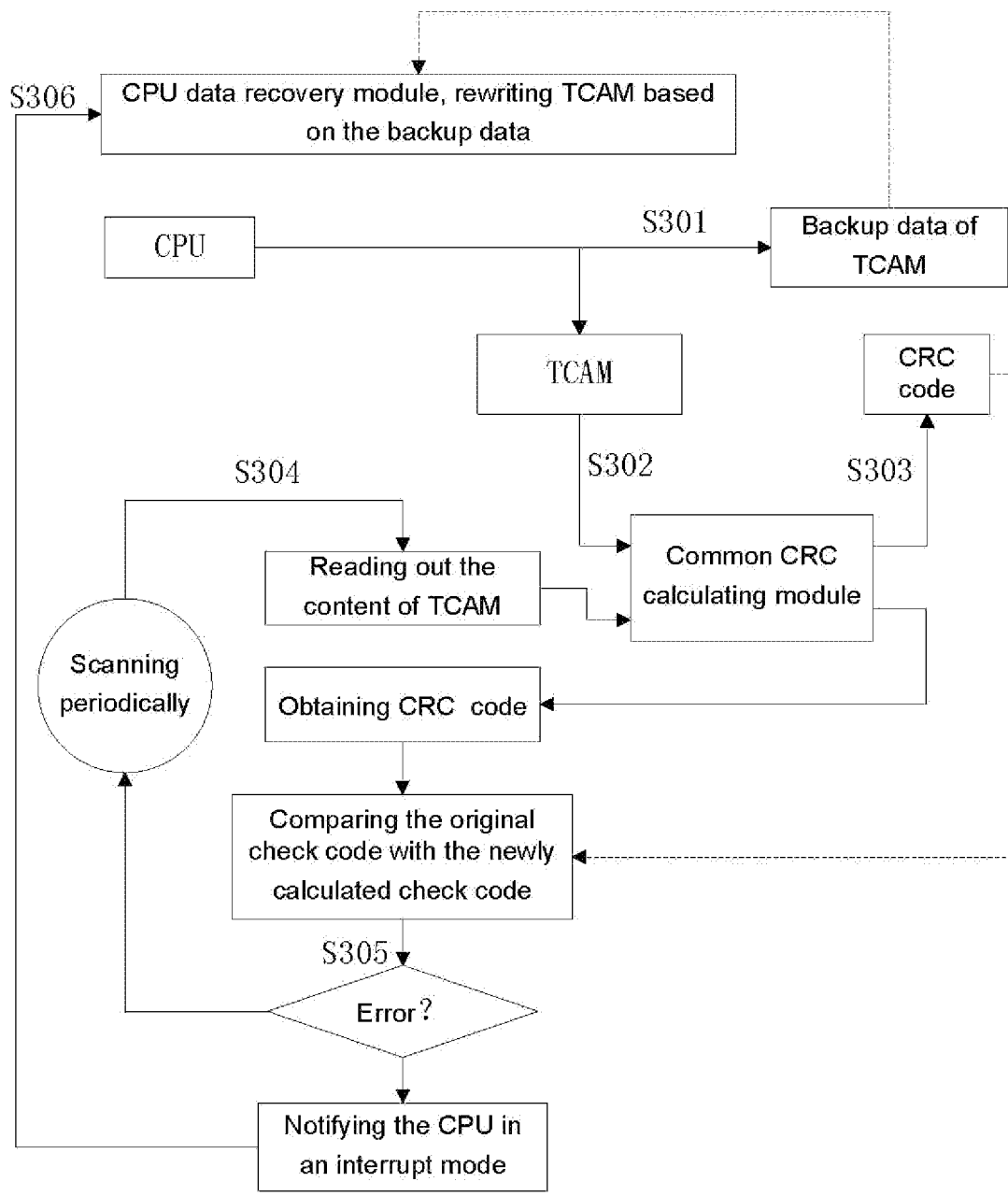
FIG. 3 is a flowchart of quick detection and correction of TCAM according to an embodiment of the disclosure.

FIG. 3 is a flowchart of quick detection and correction of TCAM in an embodiment. As shown in FIG. 3, the flow includes the following steps.

At S301, when writing the TCAM, the CPU backs up a copy of data in its memory.

At S302 to S303, when writing the TCAM, the chip needs to automatically calculate a CRC code and stores it in the chip's own SRAM.

At S304, the chip periodically scans the TCAM, calculates the CRC code, and compares it with the previously stored CRC code.

At S305, whether an error occurs in the TCAM can be known by comparing the CRC code.

At S306, in the case of an error, the CPU rewrites the TCAM based on the backup data.

To sum up, in the present embodiment, when the TCAM is written, the check code is calculated according to a CRC check principle and saved in the chip, the TCAM is periodically scanned and the check code is calculated, and the new check code is compared with the original check code, so as to realize the error detection of the TCAM. In addition, the TCAM is backed up by using the data backed up in the CPU. In the design of chip, the backup data of the whole TCAM is not saved, but only the CRC code is saved, and the error of the TCAM can be detected quickly by using the CRC code.

Through the above description of implementation modes, those skilled in the art may clearly know that the method according to the above embodiments may be implemented by means of software plus a necessary common hardware platform, certainly by means of hardware; but in many cases, the former is the better implementation. Based on this understanding, the technical solution of the embodiments of the disclosure substantially or the part making a contribution to the conventional art can be embodied in the form of software product; the computer software product is stored in a storage medium (for example, a Read-Only Memory (ROM)/Random Access Memory (RAM), a magnetic disk, and a compact disc) and includes a number of instructions to make a computer device (which can be a personal computer, a server or a network device, etc.) perform all or part of the method in each embodiment of the disclosure.

In the embodiments, a device for detecting stored data is also provided, which is configured to implement the above embodiments and preferred implementation modes. The embodiments and preferred implementations that have been elaborated will not be repeated here. The term "module" used below can realize a combination of software and/or hardware with an intended function. Although the device described in the following embodiment is realized through software better, the realization through hardware or a combination of software and hardware is possible and conceived.

Figure 4:
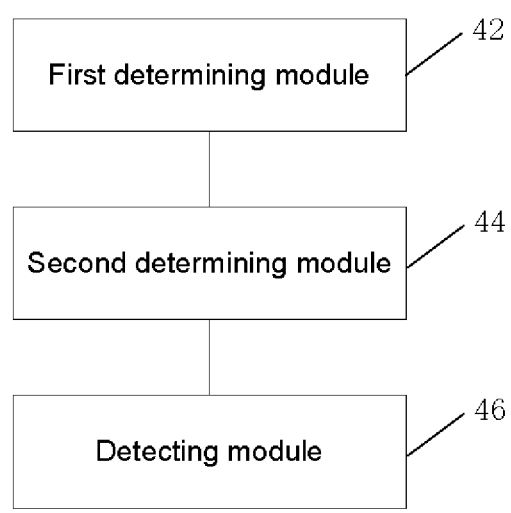
FIG. 4 is a structural block diagram of a device for detecting stored data according to an embodiment of the disclosure.

FIG. 4 is a structural block diagram of a device for detecting stored data according to an embodiment of the disclosure. As shown in FIG. 4, the device includes: a first determining module 42, a second determining module 44, and a detecting module 46. The device is described in detail below.

The first determining module 42 is configured to determine the first check information of the first data stored in the memory in the current period.

The second determining module 44 is connected to the first determining module 42, and is configured to compare the first check information with the second check information to obtain the check result. The second check information is check information of the second data stored in the memory in a period prior to the current period.

The detecting module 46 is connected to the second determining module 44, and is configured to detect the correctness of storage of the second data according to the check result.

Through the above steps, the first check information of the first data stored in the memory in the determined current period is determined, the first check information is compared with the second check information to obtain the check result, the second check information being check information of the second data stored in the memory in a period prior to the current period; and the correctness of data storage is detected according to the check result. That is, whether the data stored in the memory is correct can be quickly detected. Therefore, the problem in the related art of being unable to quickly detect the correctness of the data stored in the memory can be solved, thereby achieving the effect of quickly detecting the correctness of the data stored in the memory.

In an embodiment, the execution body of the above steps may be, but not limited to, a terminal.

It is to be noted that the second data is the original data before it is stored in the memory, and the first data is the data after it is stored in the memory.

In an optional embodiment, before the first check information of the first data stored in the memory in the current period is determined, it is needed to write the second data in the memory and calculate the second check code of the second data by using the CRC algorithm. The second check code is included in the second check information.

It is to be noted that before the second data is written in the memory, the CPU makes a data backup for the content of the TCAM.

It is to be noted that CRC check is the data transmission error detection function, which is essentially to perform the polynomial calculation on the data and attach the obtained result to the data. A receiving device also performs the same algorithm. If the CRC value calculated is consistent with that in the data, it is indicated that there is no error in the data transmission; or else, it is considered that there is an error in the data transmission.

The CRC check includes the following steps.

At S1, the polynomial calculation is performed based on the data.

At S2, the check code calculated is attached to the last position of the data.

At S3, the receiving device also performs the same algorithm to perform the polynomial calculation on the data to obtain the check code.

At S4, the values of two check codes are compared; if they are inconsistent, there is an error in the data.

In an optional embodiment, after the second check code of the second data is calculated by using the CRC algorithm, the second check code can be stored in the memory.

It is to be noted that the second check code can be considered as the original check code. The chip stores this check code in the SRAM.

In an optional embodiment, that the first check information of the first data stored in the memory in the current period is determined includes that: in the current period, the memory is scanned, and the first check code of the first data is calculated by using the CRC algorithm. The first check code is included in the first check information.

It is to be noted that the chip will periodically scan the TCAM, and calculate the check code by the same CRC algorithm according to the current TCAM content.

In an optional embodiment, when the first check code is inconsistent with the second check code, it is determined that an error occurs in the second data stored in the memory, and the error information is obtained; and it is determined based on the error information that there is a problem with the data stored in the memory. The error information is sent to the CPU in the interrupt mode to instruct the CPU to restore the storage of the second data in the memory. After receiving the interrupt, the CPU restores the TCAM according to the data previously backed up.

FIG. 3 is a flowchart of quick detection and correction of TCAM in an embodiment. As shown in FIG. 3, the flow includes the following steps.

At S301, when writing the TCAM, the CPU backs up a copy of data in its memory.

At S302 to S303, when writing the TCAM, the chip needs to automatically calculate the CRC code and stores it in the chip's own SRAM.

At S304, the chip periodically scans the TCAM, calculates the CRC code, and compares it with the previously stored CRC code.

At S305, whether an error occurs in the TCAM can be known by comparing the CRC code.

At S306, in the case of an error, the CPU rewrites the TCAM based on the backup data.

To sum up, in the present embodiment, when the TCAM is written, the check code is calculated according to a CRC check principle and saved in the chip, the TCAM is periodically scanned and the check code is calculated, and the new check code is compared with the original check code, so as to realize the error detection of the TCAM. In addition, the TCAM is backed up by using the data backed up in the CPU. In the design of chip, the backup data of the whole TCAM is not saved, but only the CRC code is saved, and the error of the TCAM can be detected quickly by using the CRC code.

An embodiment of the disclosure also provides a storage medium. The storage medium stores a computer program. The computer program is configured to execute, when running, the steps in any of the above method embodiments.

Optionally, in the present embodiment, the storage medium may be configured to store a computer program for executing the above steps.

Optionally, in the present embodiment, the storage media include, but not limited to, a USB flash disk, a Read-Only Memory (ROM), a Random Access Memory (RAM), a mobile hard disk, a magnetic disk, a compact disc, and other media capable of storing the computer program.

An embodiment of the disclosure also provides an electronic device, which includes a memory and a processor. The memory stores a computer program. The processor is configured to run the computer program to execute the steps in any of the above method embodiments.

Optionally, the electronic device may also include a transmission device and an input/output device. The transmission device is connected with the processor, and the input/output device is connected with the processor.

Optionally, in the present embodiment, the processor may be configured to execute the above steps through the computer program.

Optionally, in the present embodiment, the specific examples in the present embodiment may refer to the examples described in the above embodiments and alternative embodiments, and will not be repeated here.

It is apparent that those skilled in the art should appreciate that the above modules and steps in the embodiments of the disclosure may be implemented by a general-purpose computing device, and they may be centralized in a single computing device or distributed on a network composed of multiple computing devices; optionally, they may be implemented by a program code which is capable of being executed by the computing device, so that they may be stored in a storage device and executed by the computing device; and in some situations, the presented or described steps may be executed in an order different from that described here; or they are made into integrated circuit modules, respectively; or multiple modules and steps of them are made into a single integrated circuit module to realize. Therefore, the embodiments of the disclosure are not limited to any specific hardware and software combination.

The above is only the preferred embodiments of the disclosure and not intended to limit the disclosure. For those skilled in the art, the embodiments of the disclosure may have various modifications and changes. Any modifications, equivalent replacements, improvements and the like within the principle of the disclosure should fall within the protection scope of the embodiments of the disclosure.

INDUSTRIAL APPLICABILITY

As mentioned above, the data storage detection method and device, the storage medium and the electronic device provided by the embodiments of the disclosure have the following beneficial effects: the problem in the related art of being unable to quickly detect whether data stored in a memory is correct is solved, thereby achieving the effect of quickly detecting the correctness of data stored in a memory.

What is claimed is:

1. A method for detecting stored data, comprising:
determining first check information of first data stored in a memory in the current period;
comparing the first check information with second check information to obtain a check result, wherein the second check information is check information of second data stored in the memory in a period prior to the current period; and
detecting the correctness of storage of the second data according to the check result;
wherein before determining the first check information of the first data stored in the memory in the current period, the method further comprises:
writing the second data in the memory; and
calculating a second check code of the second data by using a Cyclic Redundancy Check (CRC) algorithm, wherein the second check code is comprised in the second check information;
wherein determining the first check information of the first data stored in the memory comprises:
in the current period, scanning the memory, and calculating a first check code of the first data by using the CRC algorithm, wherein the first check code is comprised in the first check information;

wherein detecting the correctness of storage of the second data according to the check result comprises:

when the first check code is inconsistent with the second check code, determining that an error occurs in the second data stored in the memory, and obtaining error information;

wherein after obtaining the error information, the method further comprises:

sending the error information to a Central Processing Unit (CPU) in an interrupt mode to instruct the CPU to restore the storage of the second data in the memory, wherein the memory is a Ternary Content Addressable Memory (TCAM).

2. The method according to claim 1, wherein after calculating the second check code of the second data by using the CRC algorithm, the method further comprises:

storing the second check code in the memory.

3. A storage medium, storing a computer program, wherein the computer program is configured to execute, when running, the method as claimed in claim 2.

4. An electronic device, comprising a memory and a processor, wherein the memory stores a computer program, and the processor is configured to run the computer program to execute the method as claimed in claim 2.

5. A storage medium, storing a computer program, wherein the computer program is configured to execute, when running, the method as claimed in claim 1.

6. An electronic device, comprising a memory and a processor, wherein the memory stores a computer program, and the processor is configured to run the computer program to execute the method as claimed in claim 1.

7. A device for detecting stored data, comprising:

a first determining module, configured to determine first check information of first data stored in a memory in the current period;

a second determining module, configured to compare the first check information with second check information to obtain a check result, wherein the second check information is check information of second data stored in the memory in a period prior to the current period; and a detecting module, configured to detect the correctness of storage of the second data according to the check result;

wherein before determining the first check information of the first data stored in the memory in the current period, the device is further configured to:

write the second data in the memory; and calculate a second check code of the second data by using a Cyclic Redundancy Check (CRC) algorithm, wherein the second check code is comprised in the second check information;

wherein the first determining module is further configured to, in the current period, scan the memory, and calculate a first check code of the first data by using the CRC algorithm, and the first check code is comprised in the first check information;

wherein the device is further configured to, when the first check code is inconsistent with the second check code, determine that an error occurs in the second data stored in the memory, and obtain error information, and send the error information to a Central Processing Unit (CPU) in an interrupt mode to instruct the CPU to restore the storage of the second data in the memory, wherein the memory is a Ternary Content Addressable Memory (TCAM).

* * * * *